(12) United States Patent
Oak

(10) Patent No.: US 9,997,243 B2
(45) Date of Patent: Jun. 12, 2018

(54) SENSE AMPLIFIER, AND NONVOLATILE MEMORY DEVICE AND SYSTEM INCLUDING THE SAME

(71) Applicant: SK hynix Inc., Icheon-si, Gyeonggi-do (KR)

(72) Inventor: Seung Han Oak, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/486,516

(22) Filed: Apr. 13, 2017

(65) Prior Publication Data

US 2018/0114571 A1 Apr. 26, 2018

(30) Foreign Application Priority Data

Oct. 26, 2016 (KR) .......................... 10-2016-0140337

(51) Int. Cl.
*G11C 11/00* (2006.01)
*G11C 13/00* (2006.01)

(52) U.S. Cl.
CPC ........ *G11C 13/004* (2013.01); *G11C 13/0069* (2013.01); *G11C 13/0097* (2013.01)

(58) Field of Classification Search
CPC .................................................. G11C 13/0002
USPC ......................................................... 365/148
See application file for complete search history.

(56) References Cited

U.S. PATENT DOCUMENTS

| | | | |
|---|---|---|---|
| 6,191,989 B1 | 2/2001 | Luk et al. | |
| 2014/0169089 A1* | 6/2014 | Castro | G11C 7/10 365/163 |
| 2017/0243641 A1* | 8/2017 | Kim | G11C 13/0061 |

FOREIGN PATENT DOCUMENTS

KR 1020160015992 A 2/2016

* cited by examiner

*Primary Examiner* — Hoai V Ho
(74) *Attorney, Agent, or Firm* — William Park & Associates Ltd.

(57) ABSTRACT

A nonvolatile memory device may include a cell array and a sense amplifier. The cell array may be coupled with a global bit line and a global word line, and is applied with a read voltage through the global bit line. The sense amplifier may generate an output signal based on a voltage level of a sensing node which is coupled with the cell array through the global word line, and control the voltage level of the sensing node.

20 Claims, 7 Drawing Sheets

US 9,997,243 B2

SENSE AMPLIFIER, AND NONVOLATILE MEMORY DEVICE AND SYSTEM INCLUDING THE SAME

CROSS-REFERENCES TO RELATED APPLICATION

The present application claims priority under 35 U.S.C. § 119(a) to Korean application number 10-2016-0140337, filed on Oct. 26, 2016, in the Korean Intellectual Property Office, which is incorporated herein by reference in its entirety.

BACKGROUND

1. Technical Field

Various embodiments generally relate to a semiconductor technology, and, more particularly, to a sense amplifier, and a semiconductor device and system including the same.

2. Related Art

Electronic apparatuses may include a large number of electronic components. Among the electronic apparatuses, a computer system may include many electronic components which are constructed from semiconductor devices. The computer system may include a memory device. A Dynamic Random Access Memory (DRAM) is widely used as a general memory device because the DRAM has advantages in that it is able to input/output data at a high speed and is capable of a random access. However, because the DRAM includes memory cells constructed from a capacitor, the DRAM has a volatile characteristic in that it loses stored data when power supply is cut off. In order to overcome such a disadvantage of the DRAM, a flash memory device has been developed. Because the flash memory device includes memory cells each constructed by a floating gate, the flash memory device may have a nonvolatile characteristic in that the flash memory device is able to retain stored data even though power supply is cut off. However, the flash memory device has disadvantages in that the flash memory device performs a data input/output operation at a speed markedly slower than the DRAM and is difficult to perform a random access.

Recently, next-generation memory devices, such as a phase change RAM, a magnetic RAM, a resistive RAM, and a ferroelectric RAM, which have a high operation speed and a nonvolatile characteristic, are being developed. The next-generation memory devices have advantages in that they have a nonvolatile characteristic and are able to operate at a high speed. In particular, the PRAM includes memory cells each of which is configured by a chalcogenide compound, and may store data by changing a resistance value of each memory cell.

SUMMARY

In an embodiment, a nonvolatile memory device may include a read voltage generation circuit configured to apply a read voltage to a global bit line, a cell array having one end which is coupled with a global bit line and an other end which is coupled with a global word line, and a sense amplifier configured to generate an output signal based on a voltage level of a sensing node which is coupled with the global word line, and control the voltage level of the sensing node.

In an embodiment, a nonvolatile memory device may include a read voltage generation circuit configured to apply a read voltage to a global bit line, a cell array having one end which is coupled with the global bit line and an other end which is coupled with a global word line, a sense amplifier configured to generate an output signal based on a voltage level of a sensing node which is coupled with the global word line, and control the voltage level of the sensing node, and a first voltage stabilization unit coupled between the global word line and the sensing node, and configured to stabilize the voltage level of the sensing node.

DETAILED DESCRIPTION

Hereinafter, a sense amplifier, and a semiconductor device and system including the same will be described below with reference to the accompanying drawings through various example embodiments.

Figure 1:
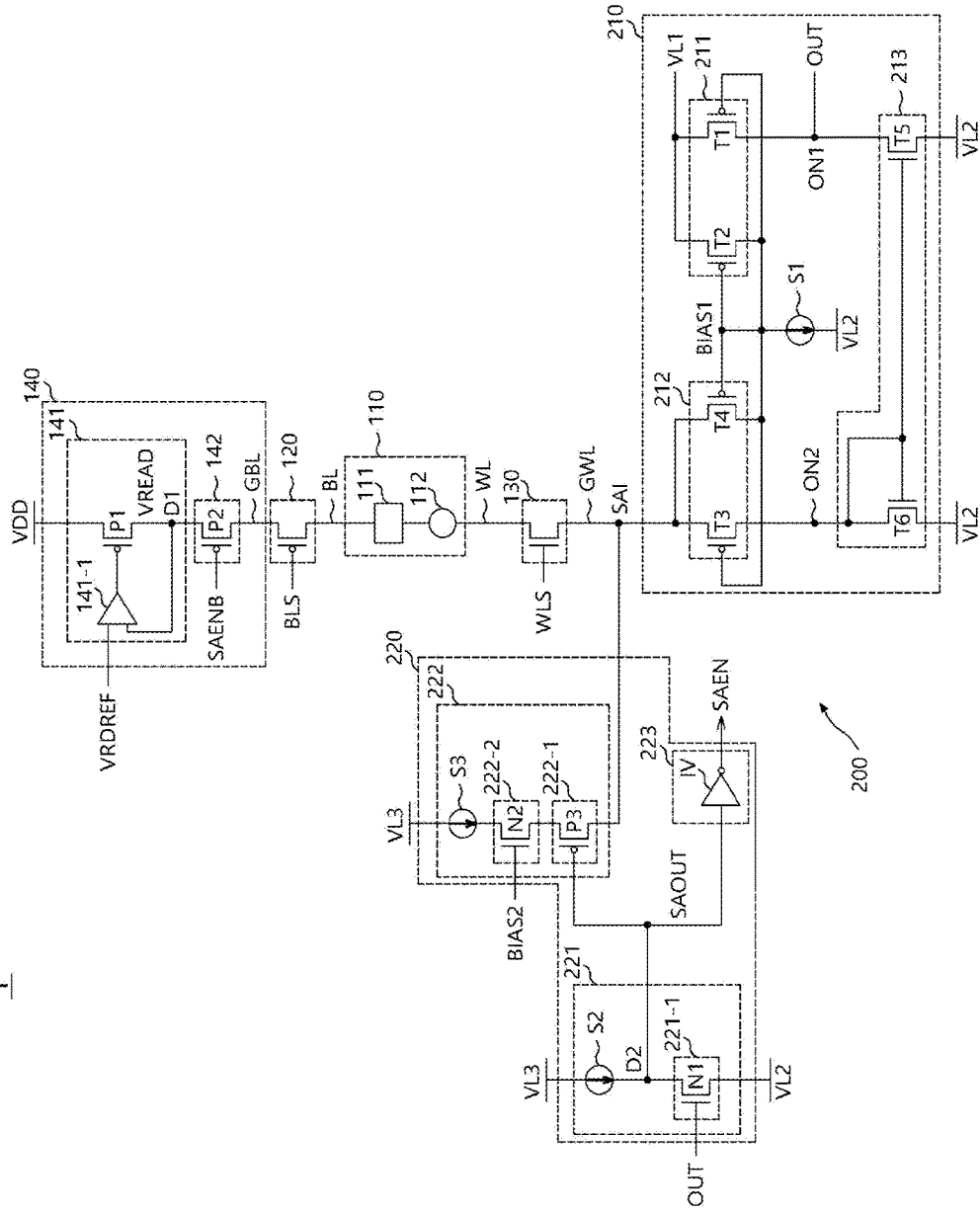
FIG. 1 is a diagram illustrating a representation of an example configuration of a nonvolatile memory device in accordance with an embodiment.
Figure 2:
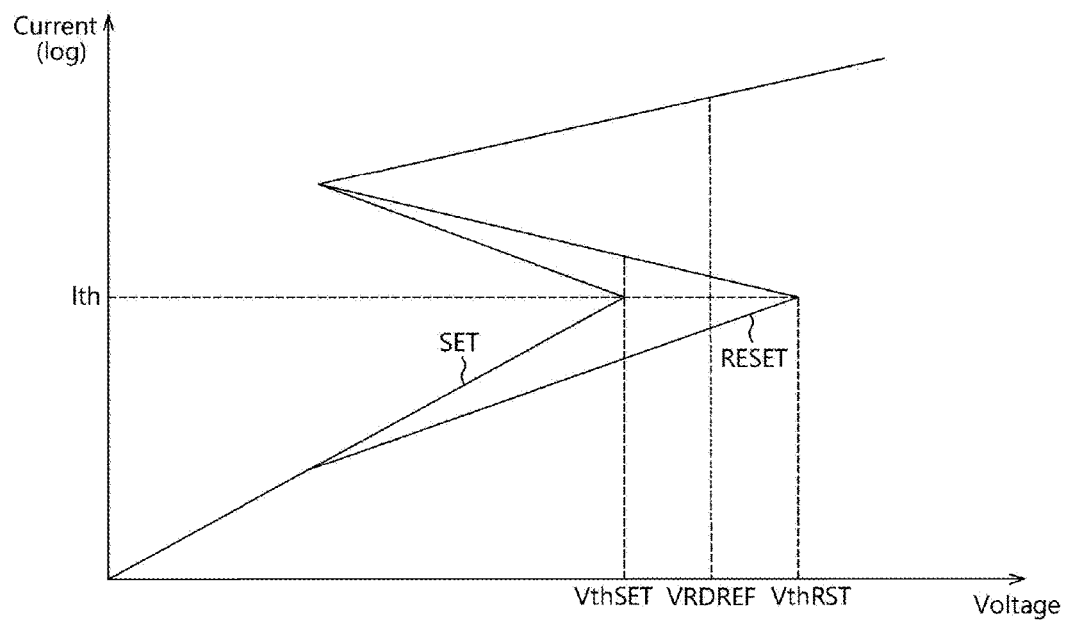
FIG. 2 is a representation of an example graph to assist in an explanation of current and voltage characteristics of a switching element shown FIG. 1.

FIG. 1 is a diagram illustrating a representation of an example configuration of a nonvolatile memory device 1 in accordance with an embodiment. In FIG. 1, the nonvolatile memory device 1 may include a cell array 110 capable of storing data. The cell array 110 may include a memory cell 111 and a switching element 112. The memory cell 111 may be constructed from a variable resistance material, and store data. For example, the memory cell 111 may be programmed and/or written to a high resistance state or a low resistance state. The high resistance state may be defined as reset data, and the low resistance state may be defined as set data. The switching element 112 may cause current to flow in a specified direction, like a diode. The switching element 112 may show a threshold switching effect. The switching element 112 may be made of glassy materials such as chalcogenide materials. For example, the switching element 112 may be a threshold switching element such as an Ovonic threshold switch (OTS). The Ovonic threshold switch may cause a large amount of current to abruptly flow therethrough, when more current than a threshold current is applied or a voltage level difference of both ends of the Ovonic threshold switch is equal to or greater than the level of a threshold voltage. FIG. 2 is a representation of an example of a graph to assist in the explanation of current and voltage characteristics of the switching element 112 shown FIG. 1. In FIG. 2, the horizontal axis may represent voltage, and the vertical axis may represent a current magnitude in log scale. The switching element 112 may be turned off when an amount of current equal to or less than a threshold current value Ith flows or a voltage difference of both ends of the switching element 112 is equal to less than a threshold voltage value VthSET. If the switching element 112 is turned off, only a substantially small amount of current may flow through the memory cell 111. If an amount of current applied to the switching element 112 increases and becomes larger than the threshold current value Ith or a voltage difference of both ends of the switching element 112 becomes greater than the threshold voltage value VthSET, the switching element 112 may be turned on. If the switching element 112 is turned on, a substantially large amount of current may flow through the memory cell 111. The switching element 112 may have the threshold voltage VthSET when the memory cell 111 is in a low resistance state and/or the memory cell 111 stores set data SET, and may have a threshold voltage VthRST when the memory cell 111 is in a high resistance state and/or the memory cell 111 stores reset data RESET. A read reference voltage VRDREF which is used to read the data stored in the memory cell 111 may have a level between the threshold voltage VthSET and the threshold voltage VthRST.

In FIG. 1, the nonvolatile memory device 1 may include a column switch 120, a row switch 130, a read voltage generation circuit 140, and a sense amplifier 200. One end of the cell array 110 may be coupled to a global bit line GBL, and the other end of the cell array 110 may be coupled to a global word line GWL. The cell array 110 may include at least one memory cell 111 having one end which is coupled with a bit line BL and an other end which is coupled with a word line WL. The nonvolatile memory device 1 may have a hierarchical bit line structure and a hierarchical word line structure. The column switch 120 may couple the global bit line GBL and the bit line BL based on a column select signal BLS. While not shown, the nonvolatile memory device 1 may further include a plurality of cell arrays and a plurality of column switches. The plurality of cell arrays and the plurality of column switches may be coupled with bit lines which are different from one another, based on column select signals respectively allocated to the bit lines. The column select signal BLS may select a specified bit line based on a column address signal. Accordingly, the global bit line GBL may be coupled selectively with a plurality of bit lines.

The row switch 130 may couple the global word line GWL and the word line WL based on a row select signal WLS. The row select signal WLS may be enabled based on a row address signal. If the row select signal WLS is enabled, the row switch 130 may couple the word line WL with the global word line GWL. While not shown, the nonvolatile memory device 1 may further include a plurality of row switches, and the plurality of row switches may be coupled in common with the global word line GWL. If a specific row select signal WLS is enabled, the global word line GWL may be coupled selectively with a cell array which is coupled with a specific word line. The global word line GWL may be coupled with a sensing node SAI.

The read voltage generation circuit 140 may apply a read voltage VREAD to the global bit line GBL. The read voltage generation circuit 140 may generate the read voltage VREAD based on the read reference voltage VRDREF during the read operation of the nonvolatile memory device 1, and the read voltage generation circuit 140 may apply the read voltage VREAD to the global bit line GBL during the read operation. The read reference voltage VRDREF may correspond to the read reference voltage VRDREF shown in FIG. 2. The read voltage generation circuit 140 may generate the read voltage VREAD which has substantially the same level as the read reference voltage VRDREF.

The sense amplifier 200 may be coupled with the sensing node SAI. The sense amplifier 200 may generate an output signal SAOUT based on the voltage level of the sensing node SAI, and control or adjust the voltage level of the sensing node SAI. The sense amplifier 200 may retain a constant voltage level of the sensing node SAI before sensing of the memory cell 111 is actually performed. That is to say, the sense amplifier 200 may precharge the sensing node SAI. Also, the sense amplifier 200 may stabilize the voltage level of the sensing node SAI when sensing of the memory cell 111 is performed.

In FIG. 1, the read voltage generation circuit 140 may include a voltage driver 141 and a voltage switch 142. The voltage driver 141 may generate the read voltage VREAD based on the read reference voltage VRDREF. The voltage driver 141 may generate the read voltage VREAD such that the read voltage VREAD may have substantially the same level as the read reference voltage VRDREF. The voltage driver 141 may include a comparator 141-1 and a first PMOS transistor P1. The comparator 141-1 may compare the read reference voltage VRDREF and a voltage level of a first node D1, and raise or lower the voltage level of the first node D1 based on a result of the comparison. The first PMOS transistor P1 may have a source and a drain which are coupled between the terminal of a power supply voltage VDD and the first node D1 and a gate which receives the output of the comparator 141-1. The first PMOS transistor P1 may drive the first node D1 with the power supply voltage VDD based on the output of the comparator 141-1, and thereby raise or lower the voltage level of the first node D1.

The voltage switch 142 may apply the read voltage VREAD the global bit line GBL based on a sensing enable signal SAEN. The voltage switch 142 may apply the read voltage VREAD to the global bit line GBL when a read operation is started. The voltage switch 142 may block the read voltage VREAD from being applied to the global bit line GBL so that an excessive current does not flow through the memory cell 111 when excessive current is sensed, for example, when the memory cell 111 is in a low resistance state or stores set data. The voltage switch 142 may include a second PMOS transistor P2. The second PMOS transistor P2 may have a source and a drain which are coupled with the first node D1 and the global bit line GBL, respectively, and a gate which receives an inverted signal SAENB of the sensing enable signal SAEN. The second PMOS transistor P2 may couple the first node D1 with the global bit line GBL when the sensing enable signal SAEN is enabled to a high level, and cut off the coupling of the first node D1 and the global bit line GBL when the sensing enable signal SAEN is disabled to a low level.

The sense amplifier 200 may include an amplification circuit 210 and a sensing control circuit 220. The amplification circuit 210 may generate an amplified signal OUT based on the voltage level of the sensing node SAT. The amplification circuit 210 may generate the amplified signal OUT by comparing the voltage level of the sensing node SAI and the level of a first low voltage VL1. The amplification circuit 210 may include a first amplification unit 211, a second amplification unit 212, and a current mirror 213.

The first amplification unit 211 may change an amount of current flowing through a first output node ON1, based on the first low voltage VL1. The second amplification unit 212 may change an amount of current flowing through a second output node ON2, based on the voltage level of the sensing node SAI. The current mirror 213 may form current paths from the first and second amplification units 211 and 212 to the terminal that has a second low voltage VL2. In other words, current mirror 213 may form current paths from the first and second output nodes ON1 and ON2 to the terminal having the second low voltage VL2. The current mirror 213 causes the same amount of current to flow from the first and second output nodes ON1 and ON2 to the terminal of the second low voltage VL2. The amplified signal OUT may be generated from the first output node ON1. The second low voltage VL2 may have a level less than the first low voltage VL1. The first low voltage VL1 may have, for example, the level of a ground voltage, when the nonvolatile memory device 1 is in a standby state, and may have, for example, the level of a bulk bias voltage or a back bias voltage having a negative voltage level less than the ground voltage, when the nonvolatile memory device 1 is in an active state.

The first amplification unit 211 may include a first transistor T1 and a second transistor T2. The first and second transistors T1 and T2 may be P-channel MOS transistors, respectively. The first transistor T1 may have a source which receives the first low voltage VL1 and a drain which is coupled with the first output node ON1. The second transistor T2 may have a source which is coupled with the source of the first transistor T1 and receives the first low voltage VL1 and a drain which is coupled with the gate of the first transistor T1. The gate of the first transistor T1 may receive a first bias voltage BIAS1. The gate of the second transistor T2 may also be coupled with the gate of the first transistor T1, and receive the first bias voltage BIAS1.

The second amplification unit 212 may include a third transistor T3 and a fourth transistor T4. The third and fourth transistors T3 and T4 may be P-channel MOS transistors, respectively. The third transistor T3 may have a source which is coupled with the sensing node SAI, a drain which is coupled with the second output node ON2, and a gate which may receive the first bias voltage BIAS1. The source of the fourth transistor T4 may be coupled in common with the sensing node SAI by being coupled with the source of the third transistor T3. The drain of the fourth transistor T4 may be coupled in common with the gate of the first transistor T1, the drain and the gate of the second transistor T2, and the gate of the third transistor T3. The gate of the fourth transistor T4 may be coupled with the gate of the third transistor T3 and may receive the first bias voltage BIAS1. The first bias voltage BIAS1 may be a voltage which may be generated to generate a reference current of the amplification circuit 210 which may have an optional voltage level. The first bias voltage BIAS1 may be generated through a current source S1. The current source S1 may have one end which is coupled in common with the gates of the first to fourth transistors T1, T2, T3 and T4, and the other end which is coupled with the terminal of the second low voltage VL2.

The current mirror 213 may include a fifth transistor T5 and a sixth transistor T6. The fifth and sixth transistors T5 and T6 may be N-channel MOS transistors. The fifth transistor T5 may have a drain and a source which are coupled with the first output node ON1 and the terminal having the second low voltage VL2, respectively. The sixth transistor T6 may have a drain and a source which are coupled with the second output node ON2 and the terminal having the second low voltage VL2, respectively. The gate of the sixth transistor T6 may be coupled with the second output node ON2 and the gate of the fifth transistor T5.

In the present embodiment, the size of the first transistor T1 may be larger than a size of the second transistor T2, the size of the third transistor T3 may be larger than a size of the fourth transistor T4, and the second transistor T2 may be substantially the same size as the fourth transistor T4. For example, the ratio of the sizes of the first transistor T1 and the second transistor T2 may be n:1 (n is a real number greater than 1), and the ratio of the sizes of the third transistor T3 and the fourth transistor T4 may be m:1 (m is a real number greater than 1). The ratio of the sizes of the fifth and sixth transistors T5 and T6 may be substantially the same as the ratio of the sizes of the first and third transistors T1 and T3. For example, the ratio of the sizes of the fifth transistor T5 and the sixth transistor T6 may be n:m. The second and fourth transistors T2 and T4 may be controlled by the first bias voltage BIAS1 and proportionally reduce the amounts of current flowing through the first and third transistors T1 and T3, and thus, an amount of current consumed by the amplification circuit 210 to perform an amplification operation may be reduced.

The sensing control circuit 220 may include an output signal generation unit 221 and a voltage stabilization unit 222. The output signal generation unit 221 may generate the output signal SAOUT based on the amplified signal OUT. The output signal generation unit 221 may change the voltage level of the output signal SAOUT based on the amplified signal OUT. The voltage stabilization unit 222 may control or adjust the voltage level of the sensing node SAI based on the output signal SAOUT. For example, the voltage stabilization unit 222 may retain the sensing node SAI at the level of the first low voltage VL1.

The output signal generation unit 221 may include a trigger section 221-1 and a current source S2. The trigger section 221-1 may drive a second node D2 to the second low voltage VL2 based on the amplified signal OUT, and generate a voltage stabilization control signal from the node D2. The current source S2 may be coupled between the terminal having a third low voltage VL3 and the second node D2. The third low voltage VL3 may have a level greater than the first low voltage VL1. For example, while the third low voltage VL3 may be, but not limited to, the ground voltage, the third low voltage VL3 may also be a voltage having a positive level. The output signal SAOUT may be generated from the second node D2. The trigger section 221-1 may include a first NMOS transistor N1. The first NMOS transistor N1 may have a drain which is coupled with the second node D2, a source which is coupled with the terminal having the second low voltage VL2, and a gate which receives the amplified signal OUT.

The voltage stabilization unit 222 may include a current switch 222-1, a clamping section 222-2, and a current source S3. The current switch 222-1 may adjust an amount of current supplied to the sensing node SAI from the current source S3, based on the output signal SAOUT. The current source S3 may be coupled with the terminal having the third low voltage VL3 through one end of the current source S3, and may supply current to the current switch 222-1. The clamping section 222-2 may clamp an amount of current supplied to the current switch 222-1 from the current source S3, based on a second bias voltage BIAS2. The second bias voltage BIAS2 may have an optional voltage level to clamp an amount of current supplied to the current switch 222-1 from the current source S3. The current switch 222-1 may include a third PMOS transistor P3. The third PMOS transistor P3 may have a drain which is coupled with the sensing node SAI and a gate which is coupled with the second node D2 and receives the output signal SAOUT. The clamping section 222-2 may include a second NMOS transistor N2. The second NMOS transistor N2 may have a drain which is coupled with the other end of the current source S3, a source which is coupled with the source of the third PMOS transistor P3, and a gate which receives the second bias voltage BIAS2.

The sensing control circuit 220 may further include a sensing enable signal generation unit 223. The sensing enable signal generation unit 223 may invert the output signal SAOUT to generate the sensing enable signal SAEN. While the sensing enable signal generation unit 223 may include an inverter IV which inverts the output signal SAOUT and generates the sensing enable signal SAEN, it is to be noted that the configuration of the sensing enable signal generation unit 223 is not limited thereto. The sensing enable signal generation unit 223 may be realized as a logic which may combine the output signal SAOUT and a read signal instructing the read operation of the nonvolatile memory device 1.

The operation of the nonvolatile memory device 1 in accordance with an embodiment will be described below with reference to FIG. 1. If a read operation of the nonvolatile memory device 1 is to be performed, the voltage driver 141 may generate the read voltage VREAD corresponding to the read reference voltage VRDREF through the first node D1, and the sensing enable signal SAEN may be enabled to the high level. The voltage switch 142 may be turned on, and apply the read voltage VREAD to the global bit line GBL. At this time, the sense amplifier 200 may precharge the voltage level of the sensing node SAI to a voltage level corresponding to the first low voltage VL1. As a specified bit line and a specified word line are selected, the column select signal BLS and the row select signal WLS may be enabled. Therefore, the cell array 110 may be coupled with the global bit line GBL and the global word line GWL, and the read voltage VREAD may be applied to the memory cell 111.

When the memory cell 111 is in a low resistance state or stores set data, the switching element 112 may be turned on, and an abruptly large amount of current may flow through the memory cell 111. If a large amount of current flows through the memory cell 111, the voltage level of the sensing node SAI may become sufficiently greater than the level of the first low voltage VL1, and the amplification circuit 210 may generate the amplified signal OUT which has a relatively lower level. The trigger section 221-1 of the output signal generation unit 221 may be turned off based on the amplified signal OUT which has a low level, and the voltage level of the second node D2 may be raised by the current source S2. Accordingly, the output signal SAOUT of a high level may be generated from the output signal generation unit 221. If the output signal SAOUT of the high level is generated, the sensing enable signal SAEN may be disabled to the low level. Therefore, the voltage switch 142 may be turned off, and cut off the coupling of the voltage driver 141 and the global bit line GBL such that the read voltage VREAD generated from the voltage driver 141 is no longer applied to the memory cell 111. Thus, the sense amplifier 200 may cut off the read voltage VREAD applied to the memory cell 111, as soon as the sense amplifier 200 senses that the memory cell 111 is in a low resistance state or stores set data, thereby preventing excessive current from flowing through the memory cell 111. Due to this fact, durability of the memory cell 111 may be retained.

When the memory cell 111 is in a high resistance state or stores reset data, the switching element 112 may be turned off, and only a small amount of current may flow through the memory cell 111. The voltage level of the sensing node SAI may be raised slightly or not be changed, and the amplification circuit 210 may generate the amplified signal OUT which has a relatively high level. The trigger section 221-1 may be turned on in response to the amplified signal OUT, and drive the second node D2 to the level of the second low voltage VL2. Accordingly, the output signal SAOUT of a low level may be generated from the output signal generation unit 221. If the output signal SAOUT of the low level is generated, the current switch 222-1 may be turned on, and current supplied from the current source S3 and the clamping section 222-2 may be applied to the sensing node SAI.

Figure 3:
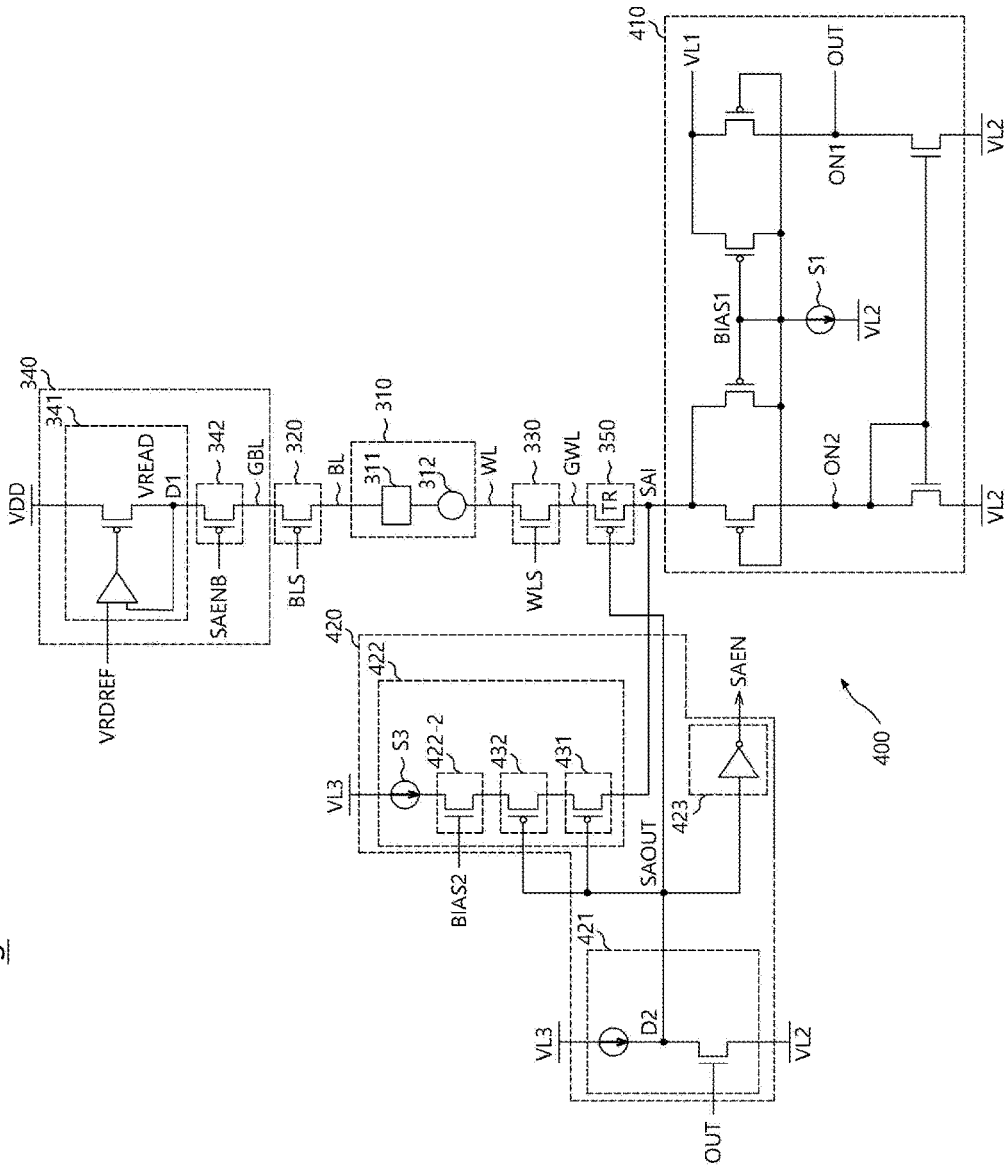
FIG. 3 is a diagram illustrating a representation of an example configuration of a nonvolatile memory device in accordance with an embodiment.

FIG. 3 is a diagram illustrating a representation of an example configuration of a nonvolatile memory device 3 in accordance with an embodiment. In FIG. 3, the nonvolatile memory device 3 may include the components of the nonvolatile memory device 1 shown in FIG. 1. Similar reference symbols are used to designate substantially the same component elements. The nonvolatile memory device 3 may include a cell array 310. The cell array 310 may include a memory cell 311 and a switching element 312. The cell array 310 may be coupled with a bit line BL and a word line WL. The nonvolatile memory device 3 may include a column switch 320, a row switch 330, a read voltage generation circuit 340, and a sense amplifier 400. The column switch 320 may couple one end of the memory cell 311 with a global bit line GBL based on a column select signal BLS, and the row switch 330 may couple an other end of the memory cell 311 with a global word line GWL based on a row select signal WLS. The read voltage generation circuit 340 may apply a read voltage VREAD to the global bit line GBL during a read operation of the nonvolatile memory device 3. The sense amplifier 400 may control the voltage level of a sensing node SAI, and generate an output signal SAOUT depending on the voltage level of the sensing node SAI which is coupled with the global word line GBL. The configurations of the cell array 310, the column switch 320, the row switch 330, and the read voltage generation circuit 340 are substantially the same as corresponding components shown in FIG. 1, and thus, repeated descriptions thereof will be omitted herein.

The sense amplifier 400 may include an amplification circuit 410 and a sensing control circuit 420. The amplification circuit 410 is substantially the same as the amplification circuit 210 shown in FIG. 1, and thus, repeated descriptions thereof will be omitted herein. The sensing control circuit 420 may generate the output signal SAOUT based on an amplified signal OUT generated from the amplification circuit 410.

In FIG. 3, the nonvolatile memory device 3 may include a first voltage stabilization unit 350. The first voltage stabilization unit 350 may control, stabilize, or adjust the voltage level of the sensing node SAI based on the output signal SAOUT. The first voltage stabilization unit 350 may be coupled between the global word line GWL and the sensing node SAI. For example, the first voltage stabilization unit 350 may lower the voltage level of the sensing node SAI when the output signal SAOUT is a high level, and raise the voltage level of the sensing node SAI when the output signal SAOUT is a low level. The first voltage stabilization unit 350 may include a variable resistance element which has a resistance value which changes based on the output signal SAOUT. In FIG. 3, the first voltage stabilization unit 350 may include a resistor transistor TR. The resistor transistor TR may have a source which is coupled with the global word line GWL, a drain which is coupled with the sensing node SAI, and a gate which receives the output signal SAOUT. The resistor transistor TR may be turned off and have a high resistance value when the output signal SAOUT is the high level. If the resistance value of the resistor transistor TR increases, the voltage level of the sensing node SAI may be lowered. Further, the resistor transistor TR may be turned on and have a low resistance value when the output signal SAOUT is the low level. If the resistance value of the resistor transistor TR decreases, the voltage level of the sensing node SAI may be raised. The first voltage stabilization unit 350 may control the voltage level of the sensing node SAI which is changed depending on a resistance state of the memory cell 311 during a read operation.

The sensing control circuit 420 may include an output signal generation unit 421, a second voltage stabilization unit 422, and a sensing enable signal generation unit 423. The output signal generation unit 421 may generate the output signal SAOUT based on the amplified signal OUT generated from the amplification circuit 410. The output signal generation unit 421 may be substantially the same as the output signal generation unit 221 shown in FIG. 1, and the second voltage stabilization unit 422 may stabilize the voltage level of the sensing node SAI based on the output signal SAOUT. The second voltage stabilization unit 422 may include a plurality of current switches 431 and 432, a current source S3, and a clamping section 422-2. The plurality of current switches 431 and 432 may supply current to the sensing node SAI, based on the output signal SAOUT. The plurality of current switches 431 and 432 may adjust an amount of current supplied to the sensing node SAI from the current source S3 and the clamping section 422-2, based on the output signal SAOUT. The current source S3 may be coupled with the terminal of a third low voltage VL3 through one end of the current source S3, and supply current to the current switches 431 and 432. The clamping section 422-2 may clamp an amount of current supplied to the current switches 431 and 432 from the current source S3, based on a bias voltage BIAS2. The second voltage stabilization unit 422 may include more current switches than the voltage stabilization unit 222 shown in FIG. 1. However, it is not intended to limit the number of current switches. The number of current switches may be 3 or more. The sensing enable signal generation unit 423 may be substantially the same as the sensing enable signal generation unit 223 shown in FIG. 1.

The operation of the nonvolatile memory device 3 in accordance with an embodiment will be described below with reference to FIG. 3. If a read operation of the nonvolatile memory device 3 is to be performed, a voltage driver 341 may generate the read voltage VREAD based on a read reference voltage VRDREF through a first node D1, and a sensing enable signal SAEN may be enabled to a high level. The read voltage VREAD may have substantially the same level as the read reference voltage VRDREF. A voltage switch 342 may be turned on, and apply the read voltage VREAD to the global bit line GBL. The sense amplifier 400 may precharge the voltage level of the sensing node SAI to a voltage level corresponding to a first low voltage VL1. As a specified bit line and a specified word line are selected, the column select signal BLS and the row select signal WLS may be enabled. Therefore, the cell array 310 may be coupled with the global bit line GBL and the global word line GWL, and the read voltage VREAD may be applied to the memory cell 311.

When the memory cell 311 is in a low resistance state or when the memory cell 311 stores set data, the switching element 312 may be turned on, and an abruptly large amount of current may flow through the memory cell 311. If a large amount of current flows through the memory cell 311, the voltage level of the sensing node SAI may become sufficiently greater than the level of the first low voltage VL1, and the amplification circuit 410 may generate the amplified signal OUT which has a relatively lower level. The output signal generation unit 421 may generate the output signal SAOUT of the high level based on the amplified signal OUT. If the output signal SAOUT of the high level is generated, the resistor transistor TR of the first voltage stabilization unit 350 may be turned off. Therefore, the first voltage stabilization unit 350 may cause current flowing through the memory cell 311 to not be applied to the sensing node SAI any more, thereby lowering the voltage level of the sensing node SAI. Also, the sensing enable signal SAEN may be disabled to a low level and the voltage switch 342 may be turned off, thereby cutting off the coupling of the voltage driver 341 and the global bit line GBL such that the read voltage VREAD generated from the voltage driver 341 is no longer applied to the memory cell 311. Thus, the sense amplifier 400 may lower the voltage level of the sensing node SAI as soon as the sense amplifier 400 senses that the memory cell 311 is in a low resistance state or stores set data, and cut off the read voltage VREAD applied to the memory cell 311, thereby preventing excessive current from flowing through the memory cell 311.

When the memory cell 311 is in a high resistance state or stores reset data, the switching element 312 may be turned off, and only a small amount of current may flow through the memory cell 311. The voltage level of the sensing node SAI may be raised slightly or not changed, and the amplification circuit 410 may generate the amplified signal OUT which has a relatively high level. The output signal generation unit 421 may generate the output signal SAOUT of the low level based on the amplified signal OUT. If the output signal SAOUT of the low level is generated, the resistor transistor TR of the first voltage stabilization unit 350 may be turned on. Moreover, the current switches 431 and 432 of the second voltage stabilization unit 422 may be turned on, and current supplied from the current source S3 and the clamping section 422-2 may be applied to the sensing node SAI.

Figure 4:
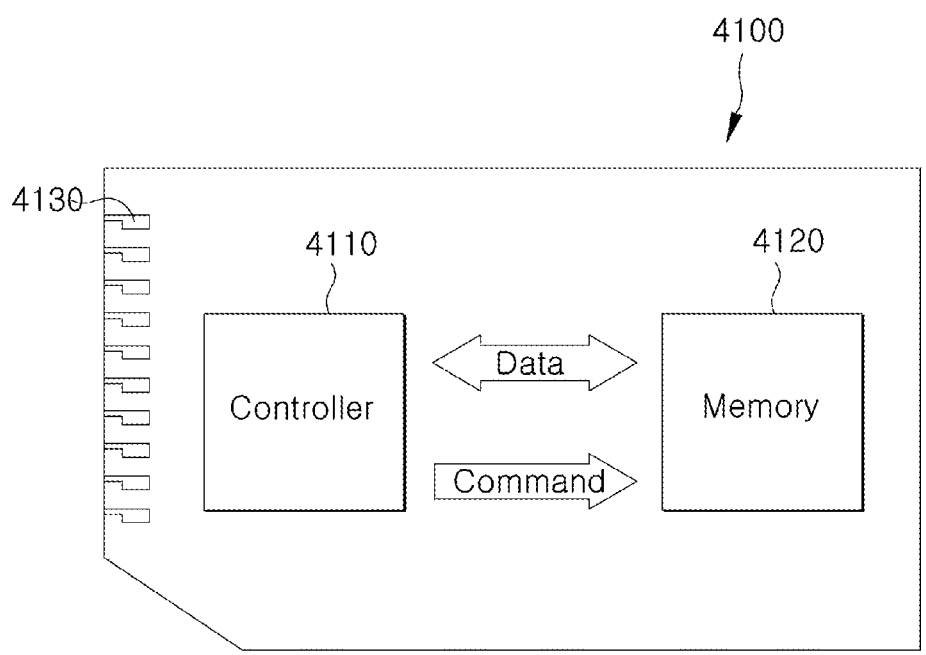
FIG. 4 is a diagram illustrating a representation of an example configuration of a memory card system including a nonvolatile memory device in accordance with an embodiment.

FIG. 4 is a diagram illustrating a representation of an example configuration of a memory card system 4100 in accordance with an embodiment. Referring to FIG. 4, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an exterior of the memory card system 4100. The memory 4120 may include the nonvolatile memory device 1 or 3 according to any one of the above-described embodiments.

The interface members 4130 may take charge of input/output of data from/to the exterior of the memory card system 4100. The memory card system 4100 may be a multimedia card (MMC), a secure digital card (SD) or a portable data storage device.

Figure 5:
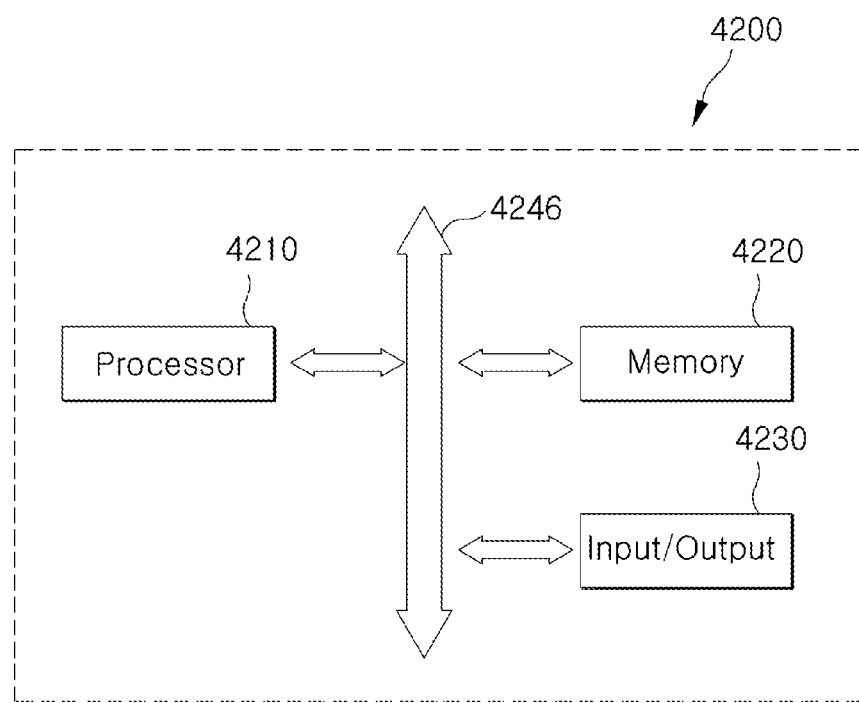
FIG. 5 is a diagram illustrating a representation of an example configuration of an electronic apparatus including a nonvolatile memory device in accordance with an embodiment.

FIG. 5 is a diagram illustrating a representation of an example configuration of an electronic apparatus 4200 in accordance with an embodiment. Referring to FIG. 5, the electronic apparatus 4200 may include a processor 4210, a memory 4220, and an input/output device 4230. The processor 4210, the memory 4220, and the input/output device 4230 may be coupled through a bus 4246.

The memory 4220 may receive a control signal from the processor 4210. The memory 4220 may store a code and data for operation of the processor 4210. The memory 4220 may be used to store data to be accessed through the bus 4246. The memory 4220 may include the nonvolatile memory device 1 or 3 according to any one of the above-described embodiments. In order for detailed realization and modification, additional circuits and control signals may be provided.

The electronic apparatus 4200 may configure various electronic control apparatuses which need the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Descriptions will be made below for the detailed realization and modification examples of the electronic apparatus 4200, with reference to FIGS. 6 and 7.

Figure 6:
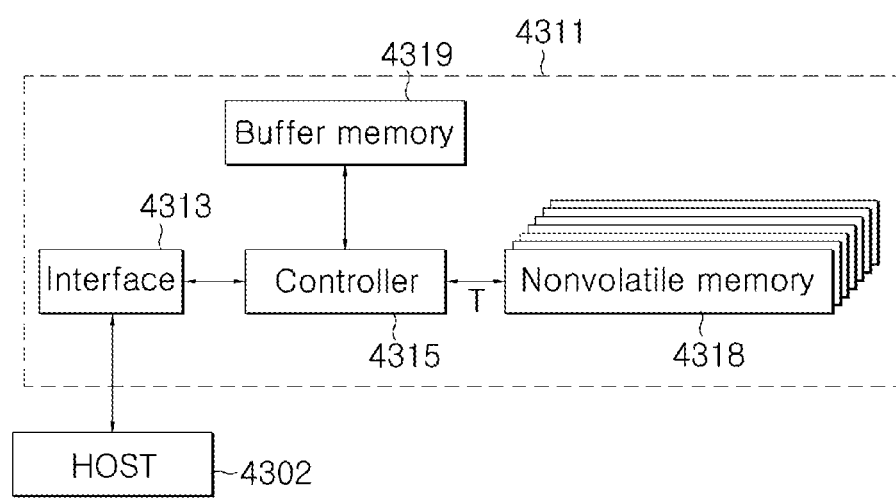
FIG. 6 is a block diagram illustrating a representation of an example data storage device including a nonvolatile memory device in accordance with an embodiment.

FIG. 6 is a block diagram illustrating a representation of an example of a data storage device in accordance with an embodiment. Referring to FIG. 6, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that a speed is high, a mechanical delay, a failure rate, heat generation and noise generation decrease, and miniaturization and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and may be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T. The data storage capacity of the solid state disk 4311 may correspond to the nonvolatile memories 4318. The buffer memory 4319 may be formed adjacent to the controller 4315, and may be electrically coupled to the controller 4315.

The interface 4313 may be coupled to a host 4302, and play the role of transmitting and receiving electrical signals such as data. For example, the interface 4313 may be a device which uses the same protocol as SATA, IDE, SCSI, and/or a combination thereof. The nonvolatile memories 4318 may be coupled to the interface 4313 via the controller 4315.

The nonvolatile memories 4318 may play the role of storing the data received through the interface 4313. Each of the nonvolatile memories 4318 may include the nonvolatile memory device 1 or 3 according to any one of the above-described embodiments. The nonvolatile memories 4318 have a characteristic that the data stored therein are retained even though power supply to the solid state disk 4311 is cut off.

The buffer memory 4319 may include a volatile memory. The volatile memory may be a DRAM and/or an SRAM. The buffer memory 4319 has a relatively high operation speed when compared to the nonvolatile memories 4318.

The data processing speed of the interface 4313 may be relatively faster when compared to the operation speed of the nonvolatile memories 4318. The buffer memory 4319 may temporarily store data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may increase the effective operation speed and decrease an error occurrence rate of the solid state disk 4311.

Figure 7:
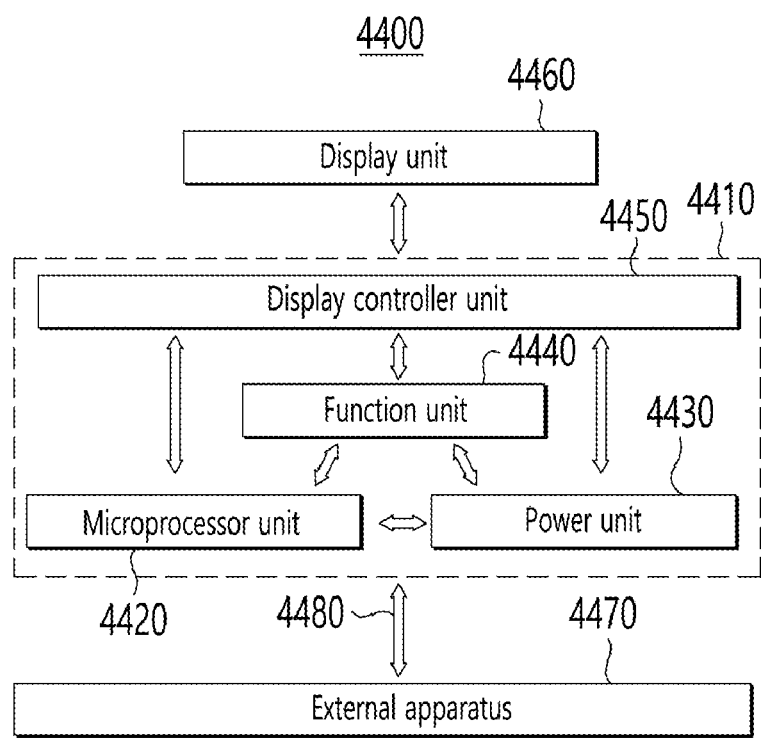
FIG. 7 is a block diagram illustrating a representation of an example of an electronic system including a sense amplifier and a nonvolatile memory device in accordance with an embodiment.

FIG. 7 is a block diagram illustrating a representation of an example of an electronic system 4400 in accordance with an embodiment. Referring to FIG. 7, the electronic system 4400 may include a body 4410, a microprocessor unit 4420, a power unit 4430, a function unit 4440, and a display controller unit 4450.

The body 4410 may be a motherboard which is formed by a printed circuit board (PCB). The microprocessor unit 4420, the power unit 4430, the function unit 4440, and the display controller unit 4450 may be mounted to the body 4410. A display unit 4460 may be disposed inside the body 4410 or outside the body 4410. For example, the display unit 4460 may be disposed on the surface of the body 4410, and display the image processed by the display controller unit 4450.

The power unit 4430 may receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430, and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. In the case where a camera is mounted together, the function unit 4440 may also play the role of a camera image processor.

In the case where the electronic system 4400 is coupled with a memory card or the like to extend capacity, the function unit 4440 may be a memory card controller. The function unit 4440 may exchange signals with the external apparatus 4470 through a wired or wireless communication unit 4480. In the case where the electronic system 4400 needs a USB or the like to expand functionality, the function unit 4440 may play the role of an interface controller. Any one of the nonvolatile memory devices 1 and 3 in accordance with the above-described embodiments may be applied as at least any one of the microprocessor unit 4420 and the function unit 4440.

While various embodiments have been described above, it will be understood to those skilled in the art that the embodiments described are examples only. Accordingly, the sense amplifier, and the semiconductor device and system including the same described herein should not be limited based on the described embodiments.

What is claimed is:

1. A nonvolatile memory device comprising:
a read voltage generation circuit configured to apply a read voltage to a global bit line;
a cell array having one end which is coupled with the global bit line and an other end which is coupled with a global word line; and
a sense amplifier configured to generate an amplified signal based on a voltage level of a sensing node which is coupled with the global word line, to generate an output signal based on the amplified signal, and to control the voltage level of the sensing node based on the output signal.

2. The nonvolatile memory device according to claim 1, wherein the read voltage generation circuit comprises:
a voltage driver configured to generate the read voltage which has substantially the same level as a read reference voltage, based on the read reference voltage; and
a voltage switch configured to block the read voltage from being applied to the global bit line, based on a sensing enable signal.

3. The nonvolatile memory device according to claim 1, wherein the sense amplifier comprises:
an amplification circuit configured to compare the voltage level of the sensing node and a level of a first low voltage, and generating the amplified signal; and
a sensing control circuit configured to generate the output signal based on the amplified signal, and to control the voltage level of the sensing node.

4. The nonvolatile memory device according to claim 3, wherein the amplification circuit comprises:
a first amplification unit configured to change an amount of current flowing through a first output node, based on the first low voltage;
a second amplification unit configured to change an amount of current flowing through a second output node, based on the voltage level of the sensing node; and
a current mirror configured to form current paths from the first and second amplification units to a terminal having a second low voltage,
wherein the amplified signal is outputted from the first output node.

5. The nonvolatile memory device according to claim 4, wherein the first amplification unit comprises:
a first transistor having a source receiving the first low voltage, a drain coupled with the first output node, and a gate receiving a first bias voltage; and
a second transistor having a source coupled with the source of the first transistor, and a gate and a drain coupled with the gate of the first transistor.

6. The nonvolatile memory device according to claim 5, wherein the second amplification unit comprises:
a third transistor having a source coupled with the sensing node, a drain coupled with the second output node, and a gate receiving the first bias voltage; and
a fourth transistor having a source coupled with the source of the third transistor, and a gate and a drain coupled with the gate of the third transistor,
wherein a size of the fourth transistor is less than a size of the third transistor.

7. The nonvolatile memory device according to claim 6, wherein the second transistor is substantially the same size as the fourth transistor, and the first transistor is larger than the second transistor.

8. The nonvolatile memory device according to claim 7, wherein the current mirror comprises:
a fifth transistor having a drain coupled with the first output node, and a source coupled with the terminal having the second low voltage; and
a sixth transistor having a gate and a drain coupled in common with the second output node and a gate of the fifth transistor, and a source coupled with the terminal having the second low voltage,
wherein a ratio of sizes of the fifth transistor and the sixth transistor is substantially the same as a ratio of the sizes of the first transistor and the third transistor.

9. The nonvolatile memory device according to claim 3, wherein the sensing control circuit comprises:
an output signal generation unit configured to generate the output signal based on the amplified signal; and
a voltage stabilization unit configured to control the voltage level of the sensing node based on the output signal.

10. The nonvolatile memory device according to claim 9, wherein the output signal generation unit comprises:
a trigger section configured to drive a node to the second low voltage based on the amplified signal; and
a current source coupled between a terminal having a third low voltage and the node.

11. The nonvolatile memory device according to claim 9, wherein the voltage stabilization unit comprises:
a current source coupled with the terminal having the third low voltage, and configured to supply current;
a clamping section configured to clamp an amount of current supplied from the current source, based on a second bias voltage; and
a current switch configured to adjust an amount of current supplied to the sensing node from the current source based on the output signal, where the clamping section clamps the amount of current supplied to the current switch.

12. The nonvolatile memory device according to claim 9, wherein the sensing control circuit further comprises:
a sensing enable signal generation unit configured to generate a sensing enable signal by inverting the output signal.

13. A nonvolatile memory device comprising:
a read voltage generation circuit configured to apply a read voltage to a global bit line;
a cell array having one end which is coupled with the global bit line and an other end which is coupled with a global word line;
a sense amplifier configured to generate an output signal based on a voltage level of a sensing node which is coupled with the global word line, and control the voltage level of the sensing node; and
a first voltage stabilization unit coupled between the global word line and the sensing node, and configured to stabilize the voltage level of the sensing node.

14. The nonvolatile memory device according to claim 13, wherein the read voltage generation circuit comprises:
a voltage driver configured to generate the read voltage which has substantially the same level as a read reference voltage, based on the read reference voltage; and
a voltage switch configured to block the read voltage from being applied to the global bit line, based on a sensing enable signal.

15. The nonvolatile memory device according to claim 13, wherein the sense amplifier comprises:

an amplification circuit configured to compare the voltage level of the sensing node and a level of a first low voltage, and generating an amplified signal; and a sensing control circuit configured to generate the output signal based on the amplified signal, and controlling the voltage level of the sensing node.

16. The nonvolatile memory device according to claim 15, wherein the sensing control circuit further comprises:

an output signal generation unit configured to generate the output signal based on the amplified signal; and a second voltage stabilization unit configured to stabilize the voltage level of the sensing node based on the output signal.

17. The nonvolatile memory device according to claim 16, wherein the output signal generation unit comprises:

a trigger section configured to drive a node to a second low voltage based on the amplified signal; and a current source coupled between a terminal of a third low voltage and the node.

18. The nonvolatile memory device according to claim 16, wherein the second voltage stabilization unit comprises:

a current source coupled with the terminal of the third low voltage, and configured to supply current;

a clamping section configured to clamp an amount of current supplied from the current source, based on a bias voltage; and a plurality of current switches configured to adjust an amount of current supplied from the current source and the clamping section to the sensing node, based on the output signal.

19. The nonvolatile memory device according to claim 15, wherein the sensing control circuit further comprises:

a sensing enable signal generation unit configured to generate a sensing enable signal by inverting the output signal.

20. The nonvolatile memory device according to claim 13, wherein the first voltage stabilization unit comprises:

a variable resistance element having a resistance value that is changed based on the output signal.

* * * * *